United States Patent
Koshimizu (10) Patent No.: US 11,875,977 B2
(45) Date of Patent: Jan. 16, 2024

(54) PLASMA PROCESSING APPARATUS AND PLASMA PROCESSING METHOD

(71) Applicant: Tokyo Electron Limited, Tokyo (JP)

(72) Inventor: Chishio Koshimizu, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/375,917

(22) Filed: Apr. 5, 2019

(65) Prior Publication Data

US 2019/0311888 A1    Oct. 10, 2019

(30) Foreign Application Priority Data

Apr. 6, 2018 (JP) .................. 2018-073872

(51) Int. Cl.
 *H01J 37/32*  (2006.01)
 *H01L 21/67*  (2006.01)
 *H01L 21/683* (2006.01)

(52) U.S. Cl.
 CPC .... *H01J 37/32724* (2013.01); *H01J 37/3244* (2013.01); *H01J 37/32174* (2013.01); *H01J 37/32697* (2013.01); *H01L 21/67248* (2013.01); *H01L 21/6833* (2013.01); *H01J 37/32642* (2013.01); *H01J 2237/002* (2013.01); *H01J 2237/24585* (2013.01)

(58) Field of Classification Search
 None
 See application file for complete search history.

(56) References Cited

U.S. PATENT DOCUMENTS

| | | | | |
|---|---|---|---|---|
| 6,084,763 A | * | 7/2000 | Hirano | H01L 21/67248 279/128 |
| 6,273,023 B1 | * | 8/2001 | Tsuchihashi | H01J 37/32706 118/712 |
| 6,391,789 B2 | * | 5/2002 | Sango | H01J 37/32082 216/60 |
| 6,921,720 B2 | * | 7/2005 | Arita | H01L 21/3065 118/500 |

(Continued)

FOREIGN PATENT DOCUMENTS

| | | |
|---|---|---|
| JP | H07-263412 A | 10/1995 |
| JP | H11-135483 A | 5/1999 |

(Continued)

*Primary Examiner* — Jeffrie R Lund
*Assistant Examiner* — Tiffany Z Nuckols
(74) *Attorney, Agent, or Firm* — Venjuris, P.C.

(57) ABSTRACT

The plasma processing apparatus includes a chamber body, a stage, a gas supply mechanism, a DC power supply, a radio-frequency power supply, and a controller. The gas supply is configured to supply a heat transfer gas to the upper surface of the electrostatic chuck. The controller is configured to control the DC power supply. The controller controls the DC power supply to apply, to the electrostatic chuck, a voltage derived by combining an output of a first function that outputs a smaller value as the absolute value of a self-bias voltage generated according to the plasma becomes larger and an output of a second function that outputs a larger value as the pressure of the heat transfer gas supplied to the upper surface of the electrostatic chuck by the gas supply increases.

15 Claims, 5 Drawing Sheets

(56) References Cited

U.S. PATENT DOCUMENTS

| | | | | |
|---|---|---|---|---|
| 2004/0188021 | A1* | 9/2004 | Mitrovic | H01L 21/6833 156/345.52 |
| 2007/0217118 | A1* | 9/2007 | Ikuhara | H01L 21/6833 361/234 |
| 2009/0321391 | A1* | 12/2009 | Ichino | B44C 1/227 216/61 |
| 2014/0231389 | A1* | 8/2014 | Nagami | H01J 37/32706 216/67 |
| 2017/0278730 | A1* | 9/2017 | Tandou | H01J 37/32715 |

FOREIGN PATENT DOCUMENTS

| | | |
|---|---|---|
| JP | 2011-198838 A | 10/2011 |
| JP | 2011-198838 A | 11/2011 |
| JP | 2014-011215 A | 1/2014 |

\* cited by examiner

FIG. 5

PLASMA PROCESSING APPARATUS AND PLASMA PROCESSING METHOD

CROSS-REFERENCE TO RELATED APPLICATIONS

This application is based on and claims priority from Japanese Patent Application No. 2018-073872, filed on Apr. 6, 2018 with the Japan Patent Office, the disclosure of which is incorporated herein in its entirety by reference.

TECHNICAL FIELD

Embodiments of the present disclosure relate to a plasma processing apparatus and a plasma processing method.

BACKGROUND

In the manufacture of electronic devices, a plasma processing is performed for processing a substrate using a plasma processing apparatus. The plasma processing apparatus generally includes a chamber body, a stage, and a radio-frequency power supply. The chamber body provides an internal space as a chamber and the stage is provided in the chamber. The stage includes a lower electrode and an electrostatic chuck provided on the lower electrode. A radio-frequency power supply is connected to the lower electrode.

In the plasma processing, the temperature of a workpiece rises due to the heat input from plasma. Therefore, the plasma processing apparatus includes a cooling mechanism for cooling the workpiece. For example, the electrostatic chuck includes a plurality of heat transfer gas supply holes that are open towards a workpiece attracted thereto. The electrostatic chuck holds the workpiece and supplies the heat transfer gas from the heat transfer gas supply holes to the rear surface of the workpiece, thereby suppressing the temperature rise of the workpiece. Such a plasma processing apparatus is described in, for example, Japanese Patent Laid-open Publication No. 2011-198838. When raising the voltage applied to the electrostatic chuck by gradually changing the voltage, the apparatus of Japanese Patent Laid-open Publication No. 2011-198838 controls the pressure of the heat transfer gas supplied from the heat transfer gas supply holes, thereby performing a control such that the force to separate the workpiece from the attraction force of the electrostatic chuck does not exceed the electrostatic force of the electrostatic chuck.

SUMMARY

In an aspect, a plasma processing apparatus is provided. The plasma processing apparatus includes a chamber body, a stage, a gas supply, a DC power supply, a radio-frequency power supply, and a controller. The chamber body provides a chamber. The stage is provided in the chamber, and has an electrostatic chuck. The gas supply is configured to supply a heat transfer gas to the upper surface of the electrostatic chuck. The DC power supply is configured to apply a voltage to the electrostatic chuck. The radio-frequency power supply is configured to supply radio-frequency waves for generating plasma of the gas in the chamber to an electrode provided in the chamber. The controller is configured to control the DC power supply. The controller controls the DC power supply to apply, to the electrostatic chuck, a voltage derived by combining an output of a first function that outputs a smaller value as the absolute value of a self-bias voltage generated according to the plasma becomes larger and an output of a second function that outputs a larger value as the pressure of the heat transfer gas supplied to the upper surface of the electrostatic chuck by the gas supply increases.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In an aspect, a plasma processing apparatus is provided. The plasma processing apparatus includes a chamber body, a stage, a gas supply, a DC power supply, a radio-frequency power supply, and a controller. The chamber body provides a chamber. The stage is provided in the chamber, and has an electrostatic chuck. The gas supply is configured to supply a heat transfer gas to the upper surface of the electrostatic chuck. The DC power supply is configured to apply a voltage to the electrostatic chuck. The radio-frequency power supply is configured to supply radio-frequency waves for generating plasma of the gas in the chamber to an electrode provided in the chamber. The controller is configured to control the DC power supply. The controller controls the DC power supply to apply, to the electrostatic chuck, a voltage derived by combining an output of a first function that outputs a smaller value as the absolute value of a self-bias voltage generated according to the plasma becomes larger and an output of a second function that outputs a larger value as the pressure of the heat transfer gas supplied to the upper surface of the electrostatic chuck by the gas supply increases.

In the plasma processing apparatus according to an embodiment, a voltage derived by combining the output of the first function and the output of the second function is applied to the electrostatic chuck by the DC power supply. The first function is a function that outputs a smaller value as the absolute value of the self-bias voltage becomes larger. As the absolute value of the self-bias voltage becomes larger, the attraction force to the electrostatic chuck increases. In this plasma processing apparatus, by decreasing the voltage applied to the electrostatic chuck according to the increase of the absolute value of the self-bias voltage, it is possible to avoid the attraction force to the electrostatic chuck from increasing according to the increase of the absolute value of the self-bias voltage. In addition, in this plasma processing apparatus, by increasing the voltage applied to the electrostatic chuck according to the decrease of the self-bias voltage, it is possible to avoid the attraction force to the electrostatic chuck from decreasing according to the decrease of the self-bias voltage. The self-bias voltage varies depending on process conditions. That is, in the plasma processing apparatus, it is possible to avoid a large fluctuation in the attraction force to the electrostatic chuck when transitioning from a certain process condition to a different process condition. Therefore, in the plasma processing apparatus, it is possible to stabilize the attraction force to the electrostatic chuck during continuous process execution. In addition, the voltage applied to the electrostatic chuck is set using the output of the second function. The second function is a function that outputs a larger value as the pressure of the heat transfer gas increases. The pressure of the heat transfer gas acts in a direction to separate the workpiece from the electrostatic chuck. In this plasma processing apparatus, it is possible to set the voltage applied to the electrostatic chuck to be in a range in which the workpiece is not separated from the electrostatic chuck by increasing and decreasing the voltage applied to the electrostatic chuck in accordance with the increase and decrease in the pressure of the heat transfer gas. In this way, in the plasma processing apparatus according to an embodiment, since the voltage is derived by combining the outputs of the first function and the second function, it is possible to set the voltage applied to the electrostatic chuck to an optimum value. In the plasma processing apparatus according to an embodiment, it is possible to appropriately control the temperature of the workpiece on the electrostatic chuck during the plasma processing on the workpiece by setting the voltage applied to the electrostatic chuck to an optimum value.

In an embodiment, the plasma processing apparatus may include a detector configured to detect the temperature of the workpiece held on the electrostatic chuck or a temperature correlated with the temperature of the workpiece, and the controller may control the voltage application timing by the DC power supply on the basis of the temperature detected by the detector. In this case, the plasma processing apparatus may cause the workpiece to be attracted to the electrostatic chuck at a timing corresponding to the temperature of the workpiece.

In an embodiment, the controller may control the DC power supply such that, after the radio frequency waves are applied to the electrode by the radio-frequency power supply, voltage application to the electrostatic chuck is started at a first timing when the temperature detected by the detector is equal to or higher than a predetermined temperature threshold, at a second timing at which an expected time when the temperature of the workpiece becomes equal to or higher than the predetermined temperature threshold is elapsed, or at an earlier one of the first timing and the second timing. In this case, compared with the case where a voltage is applied to the electrostatic chuck at a timing at which radio-frequency waves are applied to the lower electrode by the radio frequency power source, in the plasma processing apparatus, it is possible to shorten the time until the temperature of the workpiece reaches the target temperature. Therefore, it is possible to improve temperature responsiveness in this plasma processing apparatus.

In an embodiment, the controller may control the gas supply such that the supply of the heat transfer gas is started at the same timing as the voltage application by the DC power supply or after the lapse of a predetermined time. In this case, in the plasma processing apparatus, it is possible to start the temperature adjustment while suppressing the workpiece from being separated from the electrostatic chuck by the pressure of the heat transfer gas.

In an embodiment, the controller may control the gas supply such that, after the radio frequency waves are applied to the electrode by the radio-frequency power supply and the voltage application by the DC power supply is started, the supply of the heat transfer gas is started at a third timing when the temperature detected by the detector becomes equal to or higher than a predetermined temperature threshold, at a fourth timing when an expected time at which the temperature of the workpiece becomes equal to or higher than the predetermined temperature threshold is elapsed, or at an earlier one of the third timing and the fourth timing. In this case, compared with the case where the supply of the heat transfer gas is started at a timing at which radio frequency waves are applied to the lower electrode by the radio frequency power source, in the plasma processing apparatus, it is possible to shorten the time until the temperature of the workpiece reaches the target temperature. Therefore, it is possible to improve temperature responsiveness in this plasma processing apparatus.

In an embodiment, as an example, the controller may control the gas supply such that the pressure of the heat transfer gas increases with the lapse of time. In this case, it is possible to avoid the pressure of the heat transfer gas from suddenly increasing compared with the case where the pressure of the heat transfer gas is controlled such that the pressure reaches the target pressure at a time. Thus, in the plasma processing apparatus, it is possible to prevent the workpiece from being separated from the electrostatic chuck by the pressure of the heat transfer gas.

In an embodiment, the controller may control the gas supply such that the pressure of the heat transfer gas is equal to or lower than a predetermined heat transfer gas threshold. In this case, in the plasma processing apparatus, it is possible to avoid the workpiece from being separated from the electrostatic chuck by the pressure of the heat transfer gas.

In another aspect, a plasma processing method is provided. The method is executed using a plasma processing apparatus. The plasma processing apparatus includes a chamber body, a stage, a gas supply, a DC power supply, a radio-frequency power supply, and a controller. The chamber body provides a chamber. The stage is provided in the chamber, and has an electrostatic chuck. The gas supply is configured to supply a heat transfer gas to the upper surface of the electrostatic chuck. The DC power supply is configured to apply a voltage to the electrostatic chuck. The radio-frequency power supply is configured to supply radio-frequency waves for generating plasma of the gas in the chamber to an electrode provided in the chamber. The method includes a determination step and an application step. In the determination step, a voltage applied to the electrostatic chuck is determined by combining an output of a first function that outputs a smaller value as an absolute value of a self-bias voltage generated according to the plasma becomes larger and an output of a second function that outputs a larger value as a pressure of the heat transfer gas supplied to the upper surface of the electrostatic chuck by the gas supply increases. In the application step, the voltage determined in the determination step is applied to the electrostatic chuck. According to another aspect, the same effect as that of the plasma processing apparatus according to the aspect described above is exhibited.

Hereinafter, various embodiments will be described in detail with reference to the accompanying drawings. In each of the drawings, the same or corresponding components will be denoted by the same reference numerals.

[Outline of Substrate Processing Apparatus]

Figure 1:
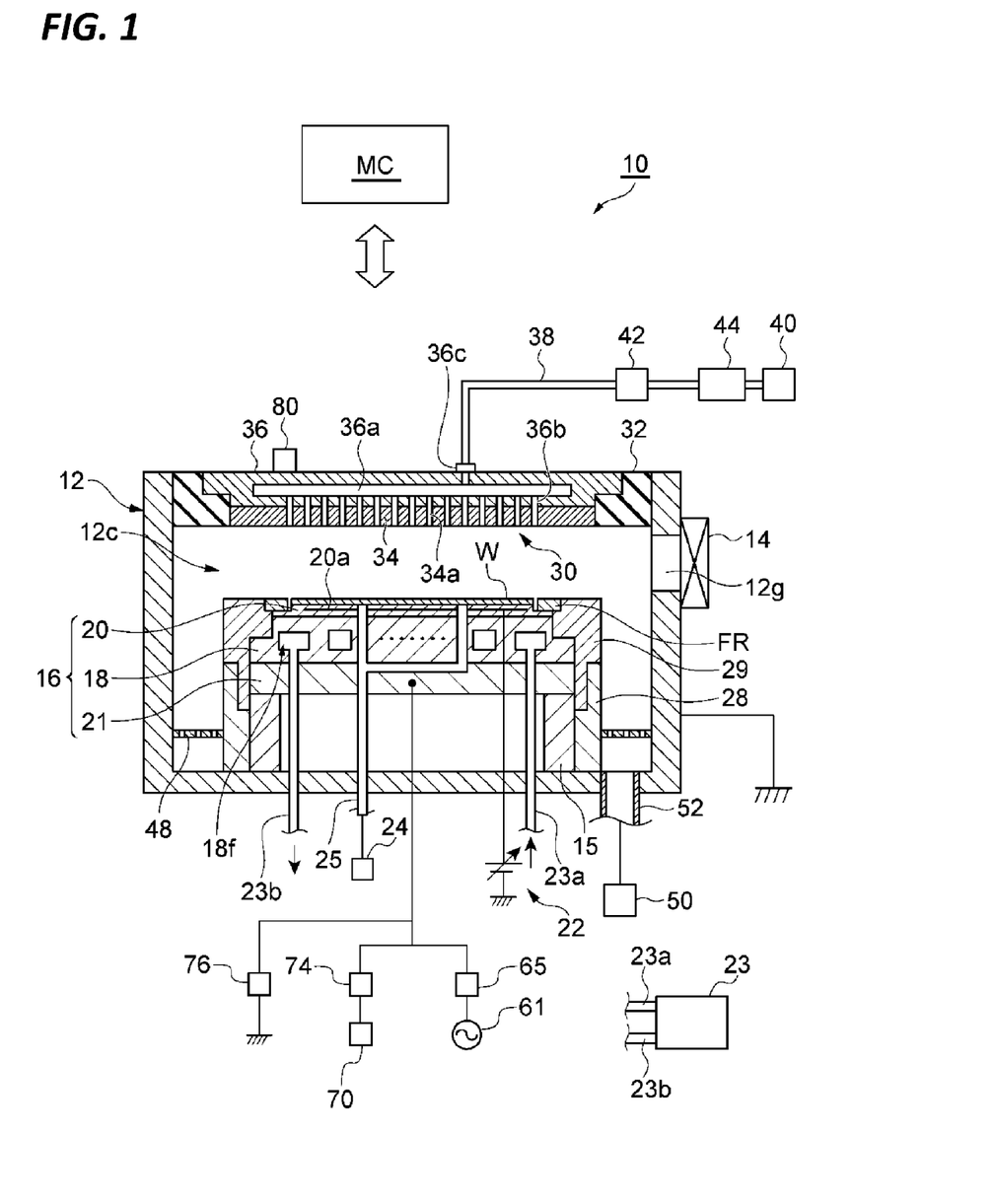
FIG. 1 is a view schematically illustrating a plasma processing apparatus according to an embodiment.

FIG. 1 is a view schematically illustrating a plasma processing apparatus according to an embodiment. As illustrated in FIG. 1, the exemplary plasma processing apparatus is a capacitively coupled plasma processing apparatus 10. The plasma processing apparatus 10 includes a chamber body 12. The chamber body 12 has a substantially cylindrical shape. The chamber body 12 provides the inner space thereof as a chamber 12c. The chamber body 12 is made of, for example, aluminum. The chamber body 12 is connected to a ground potential. A plasma-resistant film is formed on the inner wall surface of the chamber body 12, that is, the wall surface defining the chamber 12c. The film may be a film formed by an anodic oxidation processing or a ceramic membrane such as, for example, a film formed from yttrium oxide. In addition, a passage 12g is formed in the side wall of the chamber body 12. When the substrate W is loaded into the chamber 12c and when the substrate W is unloaded from the chamber 12c, the substrate W passes through the passage 12g. A gate valve 14 is provided along the side wall of the chamber body 12 for opening and closing the passage 12g.

In the chamber 12c, a support unit 15 extends upward from the bottom of the chamber body 12. The support unit 15 has a substantially cylindrical shape, and is formed of an insulating material such as, for example, alumina ceramic or quartz. A stage 16 is mounted on the support unit 15, and the stage 16 is supported by the support unit 15. The stage 16 is configured to support a substrate W within the chamber 12c. The stage 16 includes an electrostatic chuck 20. In an embodiment, the stage 16 further includes an electrode plate 21 and a lower electrode 18. The electrode plate 21 is formed of a conductive material such as, for example, aluminum, and has a substantially disc shape. The lower electrode 18 is provided on the electrode plate 21. The lower electrode 18 is formed of a conductive material such as, for example, aluminum, and has a substantially disc shape. The lower electrode 18 is electrically connected to the electrode plate 21.

A flow path 18f is provided in the lower electrode 18. The flow path 18f is a flow path for a heat exchange medium. As the heat exchange medium, a liquid coolant or a coolant (e.g., fluorocarbon) for cooling the lower electrode 18 by vaporization thereof is used. The heat exchange medium is supplied to the flow path 18f from a chiller unit 23 provided outside the chamber body 12 through a pipe 23a. The heat exchange medium supplied to the flow path 18f is returned to the chiller unit 23 through a pipe 23b. The chiller unit 23 detects the temperature of the coolant returned to the chiller unit 23 through the pipe 23b and adjusts the temperature of the coolant to be supplied to the pipe 23a. In this manner, the heat exchange medium is supplied to the flow path 18f so as to circulate between the flow path 18f and the chiller unit 23.

The electrostatic chuck 20 is provided on the lower electrode 18. The electrostatic chuck 20 has a main body formed of an insulator and a film-shaped electrode 22a provided in the main body. A first DC power supply 22 is electrically connected to the electrode 22a of the electrostatic chuck 20. The first DC power supply 22 is, for example, a variable DC power supply. The first DC power supply 22 applies a voltage of, for example, 0 to 5 kV, to the electrode 22a. When the voltage is applied from the first DC power supply 22 to the electrode of the electrostatic chuck 20, an attractive force is generated between a substrate W (an exemplary workpiece) disposed on the electrostatic chuck 20 and the electrostatic chuck 20. Due to the generated electrostatic attractive force, the substrate W is attracted to the electrostatic chuck 20, and held by the electrostatic chuck 20.

The plasma processing apparatus 10 is provided with a gas supply line 25. The gas supply line 25 supplies a heat transfer gas such as, for example, He gas, from the gas supply mechanism 24 to a space between the upper surface of the electrostatic chuck 20 and the rear surface (the lower surface) of the substrate W. The heat transfer gas is supplied at a pressure of, for example, 10 to 200 Torr. In the gas supply line 25, a detector configured to detect the pressure of the heat transfer gas to be supplied is disposed.

A cylindrical portion 28 extends upward from the bottom portion of the chamber body 12. The cylindrical portion 28 extends along the outer periphery of the support unit 15. The cylindrical portion 28 is formed of a conductive material, and has a substantially cylindrical shape. The cylindrical portion 28 is connected to the ground potential. An insulating unit 29 is provided on the cylindrical portion 28. The insulating unit 29 has an insulating property, and is made of, for example, ceramic such as, for example, quartz. The insulating unit 29 has a substantially cylindrical shape, and extends along the outer periphery of the electrode plate 21, the outer periphery of the lower electrode 18, and the outer periphery of the electrostatic chuck 20.

From the bottom of the chamber body 12, the cylindrical portion 28 extends upward. The cylindrical portion 28 extends along the outer periphery of the support unit 15. The cylindrical portion 28 is made of a conductive material, and has a substantially cylindrical shape. The cylindrical portion 28 is connected to the ground potential. The insulating unit 29 is provided on the cylindrical portion 28. The insulating unit 29 has an insulating property, and is made of ceramic such as, for example, quartz. The insulating unit 29 has a substantially cylindrical shape, and extends along the outer periphery of the electrode plate 21, the outer periphery of the lower electrode 18, and the outer periphery of the electrostatic chuck 20.

Figure 2:
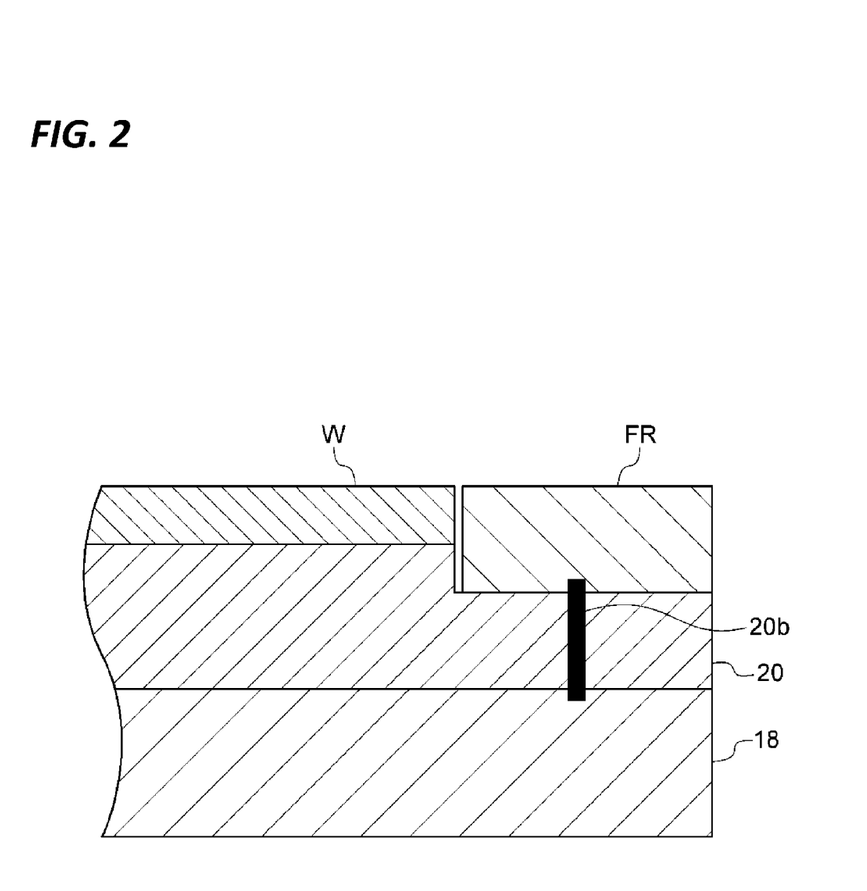
FIG. 2 is a partially enlarged sectional view of the stage and the focus ring illustrated in FIG. 1.

A focus ring FR is disposed on the outer peripheral region of the electrostatic chuck 20. The focus ring FR has a substantially annular plate shape, and is formed of, for example, silicon. The focus ring FR is disposed so as to surround the edge of the substrate W. FIG. 2 is a partially enlarged sectional view of the stage and the focus ring illustrated in FIG. 1. As illustrated in FIG. 2, in an embodiment, the focus ring FR is electrically connected to the lower electrode 18 via a conductor 20b. The conductor 20b penetrates the electrostatic chuck 20.

The plasma processing apparatus 10 further includes an upper electrode 30. The upper electrode 30 is provided above the stage 16. The upper electrode 30 closes the upper opening of the chamber body 12 together with a member 32. The member 32 has an insulating property. The upper electrode 30 is supported on the upper portion of the chamber body 12 via this member 32. As described later, when a radio-frequency power supply 61 is electrically connected to the lower electrode 18, the upper electrode 30 is connected to the ground potential.

The upper electrode 30 includes a ceiling plate 34 and a support 36. The lower surface of the ceiling plate 34 defines the chamber 12c. The ceiling plate 34 is provided with a plurality of gas ejection holes 34a. Each of the plurality of gas ejection holes 34a penetrates the ceiling plate 34 in the plate thickness direction (the vertical direction). The ceiling plate 34 is made of, for example, silicon. Alternatively, the ceiling plate 34 may have a structure in which a plasma-resistant film is provided on the surface of a base material made of aluminum. The film may be a film formed by an anodic oxidation processing or a ceramic membrane such as, for example, a film formed from yttrium oxide.

The support 36 is a component that detachably supports the ceiling plate 34. The support 36 may be formed of a conductive material such as, for example, aluminum. A gas diffusion space 36a is provided inside the support 36. A plurality of gas holes 36b extend downward from the gas diffusion chamber 36a. The plurality of gas holes 36b communicate with the plurality of gas discharge holes 34a, respectively. The support 36 is provided with a gas inlet 36c configured to guide a processing gas to the gas diffusion chamber 36a, and a gas supply pipe 38 is connected to the gas inlet 36c.

To the gas supply pipe 38, a gas source group 40 is connected through a valve group 42 and a flow rate controller group 44. The gas source group 40 includes a plurality of gas sources. The valve group 42 includes a plurality of valves, and the flow rate controller group 44 includes a plurality of flow rate controllers. Each of the plurality of flow rate controllers of the flow rate controller group 44 is a mass flow rate controller or a pressure control-type flow rate controller. Each of the plurality of gas sources of the gas source group 40 is connected to the gas supply pipe 38 through a corresponding valve in the valve group 42 and a corresponding flow rate controller in the flow rate controllers 44. The plasma processing apparatus 10 is capable of supplying the gas from at least one gas source selected among the plurality of gas sources of the gas source group 40 to the chamber 12c at an individually adjusted flow rate.

A baffle plate 48 is provided between the cylindrical portion 28 and the side wall of the chamber body 12. The baffle plate 48 may be constituted, for example, by coating a ceramic such as, for example, yttrium oxide on an aluminum base material. A large number of through holes are formed in the baffle plate 48. Under the baffle plate 48, the exhaust pipe 52 is connected to the bottom portion of the chamber body 12. An exhaust device 50 is connected to the exhaust pipe 52. The exhaust device 50 has a pressure controller such as, for example, an automatic pressure control valve, and a vacuum pump such as, for example, a turbo molecular pump, so that the chamber 12c can be decompressed.

The plasma processing apparatus 10 further includes a radio-frequency power supply 61. The radio-frequency power supply 61 is a power supply for generating radio-frequency waves for plasma generation. The radio-frequency waves have a frequency within a range of 27 to 100 MHz, for example, a frequency of 60 MHz. The radio-frequency power supply 61 is connected to the lower electrode 18 through a matching device 65 and the electrode plate 21. The matching device 65 matches the output impedance of the radio-frequency power supply 61 and the load side (the lower electrode 18 side) impedance. In addition, the radio-frequency power supply 61 may be connected to the upper electrode 30 via the matching device 65.

The plasma processing apparatus 10 further includes a second DC power supply 70. The second DC power supply 70 is a power supply for generating a negative DC voltage applied to the focus ring FR. The second DC power supply 70 is electrically connected to the lower electrode 18 through a radio-frequency filter 74. In an embodiment, the lower electrode 18 is electrically connected to the focus ring FR. Therefore, the second DC power supply 70 is electrically connected to the focus ring FR through the radio-frequency filter 74 and the lower electrode 18.

Figure 3:
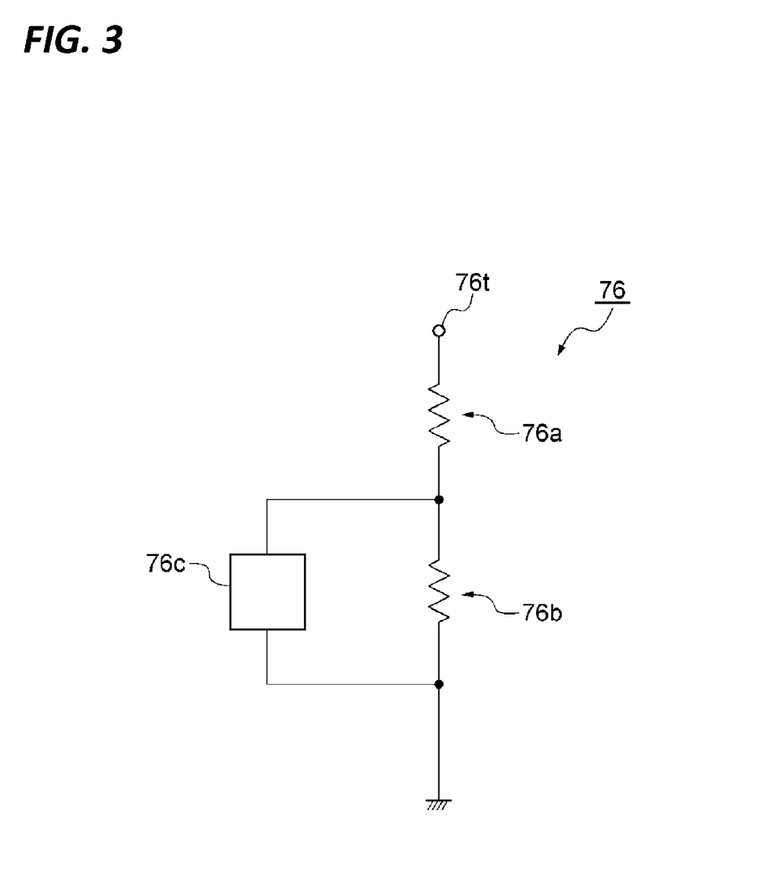
FIG. 3 is a view illustrating an exemplary self-bias voltage measurement device capable of being adopted in the plasma processing apparatus illustrated in FIG. 1.

In an embodiment, the plasma processing apparatus 10 further includes a self-bias voltage measurement device 76. FIG. 3 is a view illustrating an exemplary self-bias voltage measurement device capable of being adopted in the plasma processing apparatus illustrated in FIG. 1. The self-bias voltage measurement device 76 is configured to measure the self-bias voltage of the lower electrode 18 (or the self-bias voltage of the substrate W). In an embodiment, as shown in FIG. 3, the self-bias voltage measurement device 76 includes a resistor 76a, a resistor 76b, and a voltage sensor 76c. The resistor 76a and the resistor 76b are connected in series between a terminal 76t and the ground. The terminal 76t is connected to a node between the lower electrode 18 and the matching device 65. The voltage of the node becomes approximately the same as the self-bias voltage of the lower electrode 18 when the DC voltage from the second DC power supply 70 is not applied to the focus ring FR. The self-bias voltage measurement device 76 is able to measure the self-bias voltage by dividing the voltage at such a node and measuring the divided voltage.

In an embodiment, the plasma processing apparatus 10 further includes a temperature measurement device 80. As an example, the upper electrode 30 is provided with a temperature measurement device 80. The temperature measurement device 80 is a detector that detects the temperature of the substrate W held by the electrostatic chuck 20. The temperature measurement device 80 emits measurement light having a wavelength passing through the substrate W to the surface of the substrate W held by the electrostatic chuck 20 through a measurement window formed in the upper electrode 30. The temperature measurement device 80 detects the temperature of the substrate W based on the light interference of the light reflected from the front surface and the rear surface of the substrate W. The temperature measurement device 80 may emit measurement light from the lower electrode 18 side toward the rear surface of the substrate W.

The plasma processing apparatus 10 may further include a main controller MC (an example of a controller). The main controller MC is a computer including, for example, a processor, a storage device, an input device, and a display device, and the like, and controls each unit of the plasma processing apparatus 10. Specifically, the main controller MC executes a control program stored in the storage device, and controls each unit of the plasma processing apparatus 10 based on recipe data stored in the storage device. Thus, the plasma processing apparatus 10 executes a process specified by the recipe data.

[Control of Main Controller]
[Supply Voltage to Electrostatic Chuck]

The main controller MC is configured to control the first DC power supply 22. The main controller MC controls the voltage V supplied to the electrode 22a of the electrostatic chuck 20 by controlling the first DC power supply 22. Thus, the main controller MC controls the electrostatic attractive force of the electrostatic chuck 20. The higher the voltage supplied to the electrode 22a of the electrostatic chuck 20 is, the larger the electrostatic attractive force becomes. Therefore, as the voltage supplied to the electrode 22a of the electrostatic chuck 20 is higher, the attraction force to the electrostatic chuck 20 becomes larger.

The main controller MC couples the output of the first function and the output of the second function so as to determine the voltage to be supplied to the electrode 22a of the electrostatic chuck 20.

The first function is a function that outputs a smaller value as the absolute value of the self-bias voltage becomes larger. The first function is a function that outputs a value for adjusting the electrostatic attractive force using the absolute value of the self-bias voltage as a parameter. The first function is a monotonically decreasing function as an example. The order of the first function is not particularly limited, and th first function may be a linear function or a quadratic function. The first function may be a monomial or a polynomial. The first function may be a function referring to a table or a function derived from an empirical rule.

When plasma is generated, a self-bias voltage is applied to the substrate W. The self-bias voltage is generated according to the plasma, and varies depending on process conditions. As the absolute value of the self-bias voltage increases, the force attracting the substrate W to the electrostatic chuck 20 increases. Therefore, as the absolute value of the self-bias voltage increases, the attraction force to the electrostatic chuck 20 increases. Therefore, the main controller MC cancels the fluctuation of the attraction force due to the variation of the self-bias voltage using the first function. Specifically, the main controller MC inputs the self-bias voltage detected by the self-bias voltage measurement device 76 to the first function. The main controller MC obtains an output reflecting the variation of the self-bias voltage from the first function. By using the result of the first function, even if the self-bias has changed, a stable attraction force is realized.

The second function is a function that outputs a larger value as the pressure of the heat transfer gas increases. The second function is a function that outputs a value for adjusting the electrostatic attractive force using the pressure of the heat transfer gas as a parameter. The second function is a monotonically increasing function as an example. The order of the second function is not particularly limited, and the second function may be a linear function or a quadratic function. The second function may be a monomial or a polynomial. The second function may be a function referring to a table or a function derived from an empirical rule.

Since the heat transfer gas supplied to the substrate W is supplied to the rear surface of the substrate W, a force acts in a direction to separate the substrate W from the electrostatic chuck 20. Hereinbelow, this force is referred to as a separation force. Plasma heat input changes depending on process conditions. When the plasma heat input changes, the pressure of the heat transfer gas changes in order to suppress the temperature change of the substrate W. That is, the separation force changes depending on the process conditions. Using the pressure of the heat transfer gas as a parameter, the second function outputs a value for adjusting the electrostatic attractive force such that the attraction force becomes greater than the separation force. Specifically, the main controller MC inputs the pressure detected by the detector disposed in the gas supply line 25 to the second function. The main controller MC obtains an output reflecting the fluctuation of the pressure of the heat transfer gas from the second function. By utilizing the result of the second function, even when the pressure of the heat transfer gas changes, the substrate W is suppressed from being separated from the electrostatic chuck.

The main controller MC couples the output of the first function and the output of the second function. Coupling refers to combining. The coupling means arithmetic operations such as, for example, summation, integration, and multiplication. As an example, the main controller MC performs the following coupling in order to determine the voltage V to be supplied to the electrode 22a of the electrostatic chuck 20.

$$V = \alpha \cdot f(|Vdc|) + \beta \cdot f(P)$$

Here, $f(|Vdc|)$ is the first function, and Vdc is a self-bias voltage. $f(P)$ is the second function, and P is the pressure of the heat transfer gas. $\alpha$ and $\beta$ are constants. The main controller MC controls the first DC power supply 22 to apply the voltage V obtained by the above coupling to the electrostatic chuck 20.

[Voltage Application Timing]

The main controller MC is configured to control the voltage application timing by the first DC power supply 22 on the basis of the temperature of the substrate W held on the electrostatic chuck 20. The main controller MC acquires the temperature of the substrate W detected by the temperature measurement device 80 and uses the temperature for control.

As a specific example, the main controller MC controls the first DC power supply 22 such that, after the radio frequency (RF) is applied to the lower electrode 18 by the radio-frequency power supply 61, application of a voltage V to the electrostatic chuck 20 is started at a first timing when the temperature detected by the temperature measurement device 80 becomes equal to or higher than a predetermined temperature threshold. The temperature threshold may be set on the basis of a target temperature of the substrate W. The target temperature of the substrate W is set depending on process conditions and stored as recipe data. As one example, as the temperature threshold, a value obtained by multiplying the target temperature of the substrate W by a predetermined constant is adopted. The predetermined constant may be set in a range of, for example, 0.8 to 1.0. In this manner, the main controller MC causes the radio-frequency ON timing and the ON timing of the voltage supplied to the electrostatic chuck 20 to deviate from each other.

The main controller MC may control the first DC power supply 22 such that, after the radio frequency (RF) is applied to the lower electrode 18 by the radio-frequency power supply 61, application of the voltage V to the electrostatic chuck 20 is started at a second timing when an expected time at which the temperature of the substrate W becomes equal to or higher than the predetermined temperature threshold is elapsed. The expected time may be set in advance based on data obtained through, for example, a simulation or preliminary driving.

The main controller MC may control the first DC power supply 22 such that the application of the voltage V to the electrostatic chuck 20 is started at earlier one of the above-mentioned first and second timings.

In this manner, the main controller MC may cause the radio-frequency ON timing and the ON timing of the voltage supplied to the electrostatic chuck 20 to deviate from each other on the basis of the first timing, the second timing, or a combination thereof.

The main controller MC may be configured to control the voltage application timing by the first DC power supply 22 on the basis of a temperature correlated with the temperature of the substrate W. The temperature correlated with the temperature of the substrate W includes, for example, the temperature of the electrostatic chuck 20, the temperature of the heat exchange medium returned to the chiller unit 23 via the pipe 23b, the temperature of the focus ring FR, and the temperature of the upper electrode 30. An example of the detector that detects these temperatures may be an optical interferometer such as, for example, the temperature measurement device 80 or a temperature sensor embedded in a component.

[Pressure of Heat Transfer Gas]

The main controller MC may further control the gas supply mechanism 24 such that the pressure of the heat transfer gas is equal to or lower than the predetermined heat transfer gas threshold. The heat transfer gas threshold is a value that defines the maximum pressure of the heat transfer gas, and is predetermined. By setting the maximum pressure, a separation force equal to or higher than the expected level is avoided from acting on the substrate W.

[Pressure Supply of Heat Transfer Gas]

As an example, the main controller MC further controls the gas supply mechanism such that the pressure of the heat transfer gas increases with the lapse of time. The main controller MC increases the pressure of the heat transfer gas such that the pressure gradually approaches the target pressure of the recipe data. The target pressure may be set to be equal to or lower than the heat transfer gas threshold in advance. The main controller MC sets, for example, several pressures until the target pressure is reached to intermediate target pressures, and controls the pressure stepwise so as to achieve the intermediate target pressures at predetermined time intervals. Alternatively, the main controller MC may set the maximum increase value of the pressure, and bring the pressure close to the recipe data in a range not exceeding the increase maximum value.

[Supply Timing of Heat Transfer Gas]

The main controller MC is configured to control the supply timing of the heat transfer gas by the gas supply mechanism 24 based on the temperature of the substrate W held on the electrostatic chuck 20. The main controller MC acquires the temperature of the substrate W detected by the temperature measurement device 80 and uses the temperature for control.

As a specific example, the main controller controls the gas supply mechanism 24 such that, after the radio frequency waves are applied to the lower electrode 18 by the radio-frequency power 61 and the voltage application by the first DC power supply 22 is started, the supply of the heat transfer gas is started at a third timing when the temperature detected by the temperature sensor 80 is equal to or higher than the predetermined temperature threshold. The temperature threshold may be set on the basis of a target temperature of the substrate W. The target temperature of the substrate W is set depending on process conditions and stored as recipe data. As one example, as the temperature threshold, a value obtained by multiplying the target temperature of the substrate W by a predetermined constant is adopted. The predetermined constant may be set in a range of, for example, 0.8 to 1.0. In this manner, the main controller MC causes the radio-frequency ON timing and the ON timing of the supply of the heat transfer gas to deviate from each other.

The temperature threshold may be the same as the temperature threshold for determining the voltage application timing to the electrostatic chuck 20. In this case, the voltage application timing to the electrostatic chuck 20 and the supply timing of the heat transfer gas are synchronized. That is, the main controller MC may control the gas supply mechanism 24 such that the supply of the heat transfer gas is started at the same timing as the voltage application by the first DC power supply 22. Alternatively, the main controller MC may control the gas supply mechanism 24 such that the supply of the heat transfer gas is started after a lapse of a predetermined time from the voltage application by the first DC power supply 22.

The main controller may control the gas supply mechanism 24 such that, after the radio frequency waves (RF) are applied to the lower electrode 18 by the radio-frequency power 61 and the voltage application by the first DC power supply 22 is started, the supply of the heat transfer gas is started at a fourth timing when an expected time at which the temperature of the substrate W becomes equal to or higher than the predetermined temperature threshold is elapsed. The expected time may be set in advance based on data obtained through, for example, a simulation or preliminary driving.

The main controller MC may control the gas supply mechanism 24 such that the supply of the heat transfer gas is started at the earlier one of the above-described third and fourth timings.

In this manner, the main controller MC may cause the radio-frequency ON timing and the ON timing of the supply of the heat transfer gas to deviate from each other on the basis of the voltage application timing by the first DC power supply 22, the above-mentioned third timing and fourth timing, or a combination thereof.

[Example of Control Based on Temperature]

Figure 4:
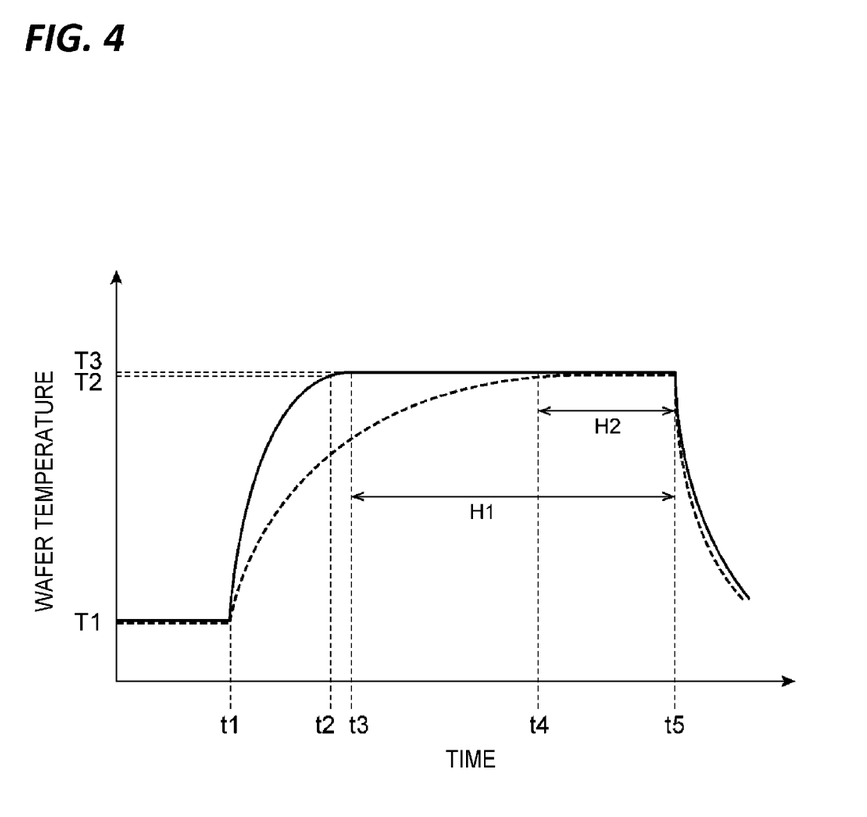
FIG. 4 is a graph representing the time dependency of a substrate temperature.

FIG. 4 is a graph representing the time dependency of a substrate temperature. The substrate temperature T1 shown in FIG. 4 is the substrate temperature before application of radio frequency. That is, the substrate temperature T1 is the substrate temperature before plasma generation. The substrate temperature T3 is the target temperature defined by the recipe data. Time t1 is the timing at which the radio-frequency waves are applied. At time t5, the plasma processing is terminated.

At time t1, when the voltage supply to the electrostatic chuck 20 and the supply of the heat transfer gas are started at the same time as the radio-frequency application timing, a graph indicated by a broken line in the drawing is obtained. In this case, the time to reach the target temperature is time t4. Therefore, the period H2 from time t4 to time t5 is a period during which the substrate temperature T3 is capable of being maintained. Hereinafter, such control will be referred to as simultaneous ON control.

As an example, the main controller MC causes the voltage application to the electrostatic chuck 20 and the supply of the heat transfer gas to be started after time t1 when the radio-frequency power is applied to the lower electrode 18 by the radio-frequency power supply 61, and at time t2 when the substrate temperature detected by the temperature measurement device 80 becomes equal to or higher than the temperature threshold T2. In this case, a graph indicated by a solid line in the drawing is obtained. Even after the lapse of time t1, plasma heat input is present. However, since the heat transfer gas is not supplied and thus the substrate W is not cooled by the heat transfer gas, the temperature increase speed becomes faster than the simultaneous ON control as indicated by the solid line graph. Therefore, the time at which the target temperature is reached is time t3 when the temperature increase speed is faster than the simultaneous ON control. The period H1 from time t3 to time t5 is a period during which the substrate temperature T3 is capable of being maintained. In this manner, by starting the voltage application to the electrostatic chuck 20 and the supply of the heat transfer gas at the time t2 after the radio frequency application timing (time t1), it is possible to ensure that a long period during which the target temperature of the process is capable of being maintained. In addition, it is possible to improve the responsiveness of temperature control.

[Example of Plasma Processing Method]

Figure 5:
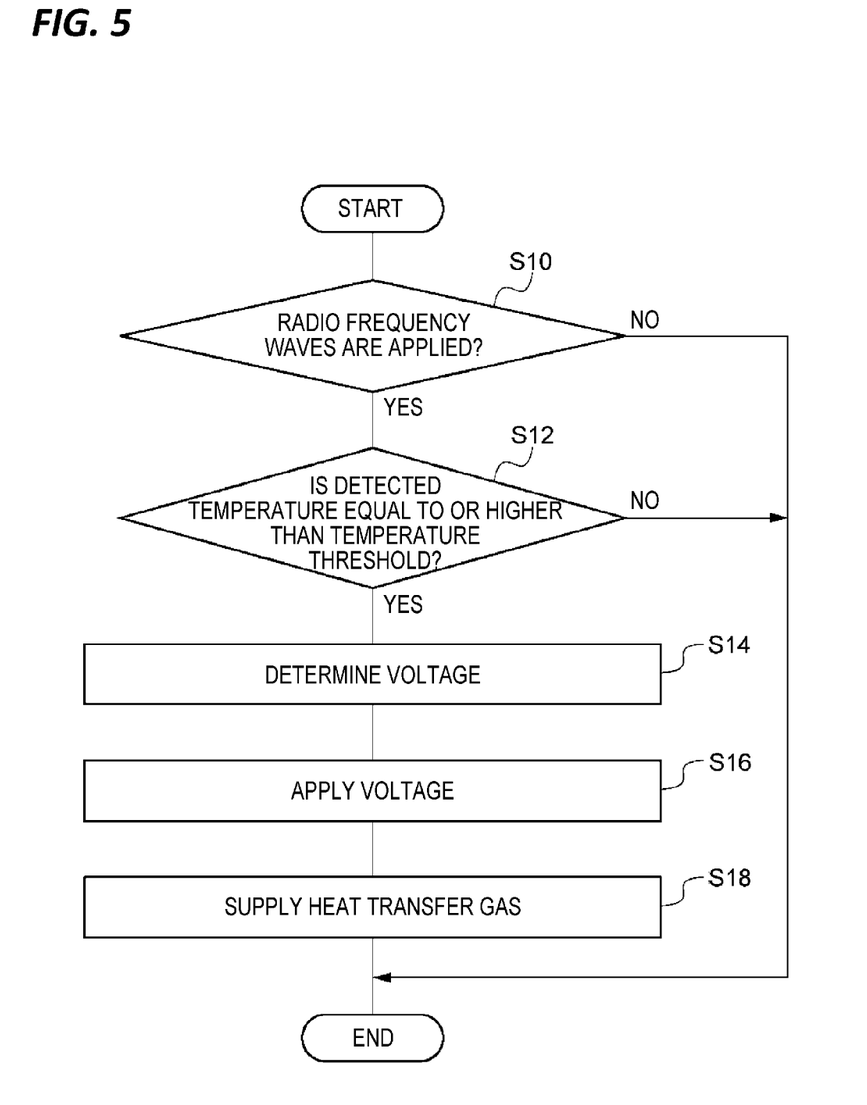
FIG. 5 is a flowchart illustrating a plasma processing method according to an embodiment.

FIG. 5 is a flowchart illustrating a plasma processing method according to an embodiment. The flowchart illustrated in FIG. 5 is executed by the main controller MC.

In a first determination step (step S10), the main controller MC determines whether or not radio-frequency waves are applied. For example, the main controller MC checks log data as to whether or not the radio frequency power supply control signal has been output to the radio-frequency power supply 61.

In the first determination step (step S10), when it is determined that the radio-frequency waves are applied, the main controller MC determines, in a second determination step (step S12), whether or not the temperature detected by the temperature measurement device 80 is equal to or higher than the temperature threshold.

In the second determination step (step S12), when it is determined that the temperature detected by the temperature measurement device 80 is equal to or higher than the temperature threshold, the main controller MC determines a voltage applied to the electrostatic chuck 20 in a voltage determination step (step S14). The main controller MC combines the output of the first function and the output of the second function to derive the voltage.

Subsequently, the main controller MC applies the voltage determined in the voltage determination step (step S14) in a voltage application step (step S16). The main controller MC determines the voltage application timing based on the temperature of the substrate W. Then, the main controller MC applies the voltage determined in the voltage determination step (step S14), at the determined voltage application timing.

Subsequently, the main controller MC supplies a heat transfer gas in a heat transfer gas supply step (step S18). The main controller MC determines the heat transfer gas supply timing based on the temperature of the substrate W. Then, the main controller MC supplies the heat transfer gas at the determined heat transfer gas supply timing.

When the heat transfer gas supply step (step S18) is completed, when it is determined that radio-frequency waves are applied in the first determination step (step S10), or when it is determined that the temperature detected by the temperature measurement device 80 is not equal to nor higher than the temperature threshold in the second determination step S12, the main controller MC terminates the operation.

The voltage determination step (step S14), the voltage application step (step S16), and the heat transfer gas supply step (step S18) are not limited to the execution in the order illustrated in FIG. 5. For example, the steps may be executed in the order of the heat transfer gas supply step (step S18), the voltage determination step (step S14), and the voltage application step (step S16), or in the order of the voltage determination step (step S14), the heat transfer gas supply step (step S18), and the voltage application step (step S16). The voltage application step (step S16) and the heat transfer gas supply step (step S18) may be performed in parallel.

SUMMARY OF EMBODIMENT

According to diversification of process conditions in recent years, a substrate W may be subjected to a plasma processing with radio-frequency power. Since the heat input from the plasma increases as the radio-frequency power increases, it is necessary to supply more heat transfer gas in order to suppress the temperature rise of the substrate W. Therefore, it is considered that the electrostatic attraction of the electrostatic chuck 20 is set to be large and the pressure of the heat transfer gas changes depending on the substrate temperature. However, when the electrostatic attractive force of the electrostatic chuck 20 is set to be excessively large, the thermally expanded substrate W may abrade the surface of the electrostatic chuck 20. When the surface state of the electrostatic chuck 20 changes due to the abrasion, the substantial contact area between the substrate W and the electrostatic chuck changes. As a result, since the heat transfer coefficient changes, the cooling efficiency of the heat transfer gas changes. Therefore, the change in the surface condition of the electrostatic chuck 20 may affect the stability in the processing of a process.

In the plasma processing apparatus 10, the voltage V derived by combining the output of the first function f(|Vdc|) and the output of the second function f(P) by the first DC power supply 22 is applied to the electrostatic chuck 20. In the plasma processing apparatus 10, by decreasing the voltage V applied to the electrostatic chuck 20 according to the increase in the absolute value of the self-bias voltage Vdc, it is possible to avoid the attraction force to the electrostatic chuck 20 from increasing according to the absolute of the self-bias voltage Vdc. In addition, in the plasma processing apparatus 10, by increasing the voltage V applied to the electrostatic chuck 20 according to the decrease of the self-bias voltage Vdc, it is possible to avoid the attraction force to the electrostatic chuck 20 from decreasing according to the decrease of the self-bias voltage Vdc. The self-bias voltage Vdc varies depending on process conditions. That is, in the plasma processing apparatus 10, it is possible to avoid a large fluctuation in the attraction force to the electrostatic chuck 20 when transitioning from a certain process condition to a different process condition. Therefore, in the plasma processing apparatus 10, it is possible to stabilize the attraction force to the electrostatic chuck 20 during continuous process execution. In addition, the voltage V applied to the electrostatic chuck 20 is set using the output of the second function f(P). The second function f(P) is a function that outputs a larger value as the pressure P of the heat transfer gas increases. The pressure P of the heat transfer gas acts in a direction to separate the substrate W from the electrostatic chuck 20. In the plasma processing apparatus 10, by increasing and decreasing the voltage V applied to the electrostatic chuck 20 according to the increase and decrease in the pressure P of the heat transfer gas, it is possible to set the voltage applied to the electrostatic chuck 20 to be in the range in which the substrate W does not separate from the electrostatic chuck 20. In this way, in the plasma processing apparatus 10, since the voltage V is derived by combining the outputs of the first function f(|Vdc|) and the second function f(P), it is possible to set the voltage V applied to the electrostatic chuck 20 to an optimum value. In the plasma processing apparatus 10, by setting the voltage applied to the electrostatic chuck 20, it is possible to appropriately control the temperature of the wafer W on the electrostatic chuck 20 during the plasma processing on the substrate W. As the pressure of the heat transfer gas is high and the voltage V becomes higher, it is possible to improve the uniformity of the in-plane temperature of the substrate W.

In the plasma processing apparatus 10, since the voltage application timing by the first DC power supply 22 is controlled on the basis of the temperature of the substrate W held on the electrostatic chuck 20 or temperatures correlated with the temperature of the substrate W (e.g., the temperature of the electrostatic chuck 20, the temperature of the heat exchange medium returned to the chiller unit 23 through the pipe 23b, the temperature of the focus ring FR, and the temperature of the upper electrode 30), the substrate W is able to be attracted to the electrostatic chuck 20 at a timing corresponding to the temperature of the substrate W.

In the plasma processing apparatus 10, the voltage V is applied to the electrostatic chuck 20 after the timing when radio-frequency waves are applied to the lower electrode 18 by the radio-frequency power supply 61 (e.g., time t1). Therefore, compared with the case where the voltage V is applied to the electrostatic chuck 20 at the timing when the radio-frequency waves are applied to the lower electrode 18 by the radio-frequency power supply 61 (e.g., time t1), in the plasma processing apparatus 10, it is possible to shorten the time until the temperature of the substrate W reaches the target temperature (e.g., the substrate temperature T3). Accordingly, it is possible to improve temperature responsiveness in the plasma processing apparatus 10. Further, in the plasma processing apparatus 10, since it is possible to shorten the time for holding the substrate W while increasing the temperature compared with the case where the voltage V is applied to the electrostatic chuck 20 at the timing when the radio-frequency waves are applied to the lower electrode 18 by the radio-frequency power supply 61 (e.g., time t1), it is possible to suppress the abrasion of the electrostatic chuck 20 due to the thermal expansion of the substrate W.

In the plasma processing apparatus 10, by further controlling the gas supply mechanism 24 such that the supply of the heat transfer gas is started at the same timing as the voltage application by the first DC power supply 22 or after the lapse of a predetermined time, it is possible to start the temperature adjustment while suppressing the separation of the substrate W from the electrostatic chuck 20 by the pressure of the heat transfer gas.

In the plasma processing apparatus 10, after the timing when the radio-frequency waves are applied to the lower electrode 18 by the radio-frequency power supply 61 (e.g., time t1) and after the voltage application by the first DC power supply 22 is started, the heat transfer gas is supplied. Therefore, compared with the case where the supply of the heat transfer gas is started at the timing when the radio-frequency waves are applied to the lower electrode 18 by the radio-frequency power supply 61 (e.g., time t1), in the plasma processing apparatus 10, it is possible to shorten the time until the temperature of the substrate W reaches the target temperature (e.g., the substrate temperature T3). Accordingly, it is possible to improve temperature responsiveness in the plasma processing apparatus 10. Further, in the plasma processing apparatus 10, since it is possible to shorten the time for holding the substrate W while increasing the temperature compared with the case where the supply of the heat transfer gas to the electrostatic chuck 20 is started at the timing when the radio-frequency waves are applied to the lower electrode 18 by the radio-frequency power supply 61 (e.g., time t1), it is possible to suppress the abrasion of the electrostatic chuck 20 due to the thermal expansion of the substrate W.

In the plasma processing apparatus 10, the gas supply mechanism 24 is further controlled such that the pressure P of the heat transfer gas increases with the lapse of time. Thus, compared with the case where the pressure P of the heat transfer gas is controlled such that the pressure P reaches the target pressure at a time, since it is possible to avoid the pressure P of the heat transfer gas from rapidly increasing, it is possible to avoid the substrate W from being separated from the electrostatic chuck 20 by the pressure P of the heat transfer gas.

In the plasma processing apparatus 10, since the gas supply mechanism 24 is further controlled such that the pressure P of the heat transfer gas is equal to or lower than the predetermined heat transfer gas threshold, it is possible to avoid the substrate W from being separated from the electrostatic chuck 20 by the pressure P of the heat transfer gas 24.

Although various embodiments have been described above, various modifications can be configured without being limited to the embodiments described above. For example, the plasma processing apparatus according to the above-described various embodiments is a capacitively coupled plasma processing apparatus. The plasma processing apparatus in a modified embodiment may be an inductively coupled plasma processing apparatus.

As described above, it is possible to appropriately control the temperature of a workpiece on the electrostatic chuck during the plasma processing on the workpiece.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
a chamber body configured to provide a chamber therein;
a stage provided in the chamber, and including an electrostatic chuck configured to hold a substrate;
a gas supply configured to supply a heat transfer gas to an upper surface of the electrostatic chuck on which the substrate is held;
a DC power supply configured to apply a voltage to the electrostatic chuck;
a radio-frequency power supply configured to supply radio frequency waves for generating plasma of a gas in the chamber to an electrode provided in the chamber;
a self-bias voltage meter configured to measure a self-bias voltage generated according to the plasma; and
a controller that executes a control program stored in a storage device to control an overall operation of the plasma processing apparatus,
wherein the controller is configured to control the DC power supply based on an absolute value of the self-bias voltage and a pressure of the heat transfer gas during a plasma processing on the substrate to apply, to the electrostatic chuck, a voltage derived by combining an output of a first function that outputs a smaller value as the absolute value of the self-bias voltage generated according to the plasma becomes larger throughout an entire period in which the self-bias voltage is generated and an output of a second function that outputs a larger value as the pressure of the heat transfer gas supplied to the upper surface of the electrostatic chuck by the gas supply during the plasma processing on the substrate increases, and
the controller is configured to calculate the output of the first function, the output of the second function, and the combination of the output of the first function and the second function.

2. The plasma processing apparatus of claim 1, further comprising:
a detector configured to detect a temperature of a workpiece held on the electrostatic chuck or a temperature correlated with the temperature of the workpiece, wherein the controller is configured to control a voltage application timing by the DC power supply based on the temperature detected by the detector.

3. The plasma processing apparatus of claim 2, wherein the controller is configured to control the DC power supply such that, after the radio frequency waves are applied to the electrode by the radio-frequency power supply, voltage application to the electrostatic chuck is started at a first timing when the temperature detected by the detector is equal to or higher than a predetermined temperature threshold, at a second timing when an expected time when the temperature of the workpiece becomes equal to or higher than the predetermined temperature threshold is elapsed, or at an earlier one of the first timing and the second timing.

4. The plasma processing apparatus of claim 3, wherein the controller is configured to control the gas supply such that supply of the heat transfer gas is started at the same timing as the voltage application by the DC power supply or after a predetermined time has elapsed.

5. The plasma processing apparatus of claim 3, wherein the temperature threshold is a value obtained by multiplying a target temperature of the workpiece stored in advance as recipe data, by a predetermined constant.

6. The plasma processing apparatus of claim 2, wherein the controller is configured to control the gas supply such that, after the radio frequency waves are applied to the electrode by the radio-frequency power supply and the voltage application by the DC power supply is started, supply of the heat transfer gas is started at a third timing when the temperature detected by the detector becomes equal to or higher than a predetermined temperature threshold, at a fourth timing when an expected time at which the temperature of the workpiece becomes equal to or higher than the predetermined temperature threshold is elapsed, or at an earlier one of the third timing and the fourth timing.

7. The plasma processing apparatus of claim 6, wherein the temperature threshold is a value obtained by multiplying a target temperature of the workpiece stored in advance as recipe data, by a predetermined constant.

8. The plasma processing apparatus of claim 2, wherein the controller is configured to control the gas supply such that the pressure of the heat transfer gas gradually increases to approach a target pressure with a lapse of time after the supply of the heat transfer gas is started.

9. The plasma processing apparatus of claim 8, wherein the controller is configured to control the gas supply such that the pressure of the heat transfer gas becomes equal to or lower than a predetermined heat transfer gas threshold.

10. The plasma processing apparatus of claim 1, wherein the controller is configured to control the gas supply such that the pressure of the heat transfer gas increases with a lapse of time.

11. The plasma processing apparatus of claim 1, wherein the controller is configured to control the gas supply such that the pressure of the heat transfer gas becomes equal to or lower than a predetermined heat transfer gas threshold.

12. The plasma processing apparatus of claim 1, wherein the controller is configured to control the DC power supply to apply, to the electrostatic chuck, a voltage derived by performing a coupling represented by the following equation:

$$V = \alpha \cdot f(|Vdc|) + \beta \cdot f(P)$$

wherein Vdc is the self-bias voltage, f(|Vdc|) is the first function, P is a pressure of the heat transfer gas, f(P) is the second function, $\alpha$ and $\beta$ are constants.

13. The plasma processing apparatus of claim 1, wherein the controller is configured to control the gas supply stepwise such that the pressure of the heat transfer gas approaches one or more intermediate target pressure, and the first function is a monotonically decreasing function throughout the entire period in which the self-bias voltage is generated.

14. A plasma processing apparatus comprising:
a chamber body configured to provide a chamber therein;
a stage provided in the chamber, and including an electrostatic chuck configured to hold a substrate;
a gas supply configured to supply a heat transfer gas to an upper surface of the electrostatic chuck on which the substrate is held;
a DC power supply configured to apply a voltage to the electrostatic chuck;
a radio-frequency power supply configured to supply radio frequency waves for generating plasma of a gas in the chamber to an electrode provided in the chamber; and
a controller programmed to control an overall operation of the plasma processing apparatus,
wherein the controller is configured to control the DC power supply based on an absolute value of the self-bias voltage and a pressure of the heat transfer gas during a plasma processing on the substrate to apply, to the electrostatic chuck, a voltage derived by combining an output of a first function that outputs a smaller value as the absolute value of a self-bias voltage generated according to the plasma becomes larger and an output of a second function that outputs a larger value as the pressure of the heat transfer gas supplied to the upper surface of the electrostatic chuck by the gas supply during the plasma processing on the substrate increases,
wherein the controller is configured to control the gas supply such that the pressure of the heat transfer gas gradually increases to approach a target pressure with a lapse of time after the supply of the heat transfer gas is started, and
the controller is configured to calculate the output of the first function, the output of the second function, and the combination of the output of the first function and the second function.

15. The plasma processing apparatus of claim 14, wherein the controller is configured to control the gas supply stepwise such that the pressure of the heat transfer gas approaches one or more intermediate target pressures.

* * * * *